(12) United States Patent
Takada

(10) Patent No.: US 10,385,185 B2
(45) Date of Patent: Aug. 20, 2019

(54) SEALING RESIN COMPOSITION AND SEALING SHEET

(71) Applicant: AJINOMOTO CO., INC., Tokyo (JP)

(72) Inventor: Motoyuki Takada, Kawasaki (JP)

(73) Assignee: AJINOMOTO CO., INC., Tokyo (JP)

( * ) Notice: Subject to any disclaimer, the term of this patent is extended or adjusted under 35 U.S.C. 154(b) by 0 days.

(21) Appl. No.: 15/147,992

(22) Filed: May 6, 2016

(65) Prior Publication Data

US 2016/0244590 A1 Aug. 25, 2016

Related U.S. Application Data

(63) Continuation of application No. PCT/JP2014/079523, filed on Nov. 7, 2014.

(30) Foreign Application Priority Data

Nov. 8, 2013 (JP) .................... 2013-232532

(51) Int. Cl.

| | | |
|---|---|---|
| *C08K 3/36* | (2006.01) | |
| *C08G 59/40* | (2006.01) | |
| *C08L 63/00* | (2006.01) | |
| *C08L 71/00* | (2006.01) | |
| *C08L 71/10* | (2006.01) | |
| *C08K 3/26* | (2006.01) | |
| *C08K 3/34* | (2006.01) | |

(Continued)

(52) U.S. Cl.
CPC .............. *C08K 3/36* (2013.01); *C08G 59/063* (2013.01); *C08G 59/245* (2013.01); *C08G 59/40* (2013.01); *C08K 3/26* (2013.01); *C08K 3/346* (2013.01); *C08L 63/00* (2013.01); *C08L 71/00* (2013.01); *C08L 71/10* (2013.01); *H01L 31/049* (2014.12); *H01L 31/0481* (2013.01); *H01L 51/5253* (2013.01); *C08G 2650/56* (2013.01); *H01L 51/5246* (2013.01); *Y02E 10/50* (2013.01)

(58) Field of Classification Search
CPC .. C08K 3/36; C08K 3/26; C08K 3/346; H01L 31/049; H01L 31/0481; H01L 51/5253; H01L 51/5246; C08G 59/063; C08G 59/245; C08G 59/40; C08G 2650/56; C08L 63/00; C08L 71/00; C08L 71/10; Y02E 10/50
USPC .......................................... 523/457
See application file for complete search history.

(56) References Cited

U.S. PATENT DOCUMENTS

| | | | | |
|---|---|---|---|---|
| 2007/0082978 A1* | 4/2007 | Suzuki | ............... | C01F 11/02 523/210 |
| 2007/0208106 A1* | 9/2007 | Chen | ............... | C08G 59/226 523/137 |

(Continued)

FOREIGN PATENT DOCUMENTS

| | | |
|---|---|---|
| JP | 2011-84667 A | 4/2011 |
| WO | 2010/084938 A1 | 7/2010 |
| WO | 2010/084939 A1 | 7/2010 |

*Primary Examiner* — David T Karst
(74) *Attorney, Agent, or Firm* — Oblon, McClelland, Maier & Neustadt, L.L.P.

(57) ABSTRACT

The present invention aims to provide a resin composition superior in all of resistance to moisture permeability, adhesive strength and transparency. This object is achieved by a resin composition containing 3-38 parts by mass of (B) calcined hydrotalcite, 1-16 parts by mass of (C) talc, and 1-16 parts by mass of (D) silica based on 80 parts by mass of (A) an epoxy resin.

22 Claims, 3 Drawing Sheets

(51) Int. Cl.
*H01L 31/048* (2014.01)
*H01L 31/049* (2014.01)
*C08G 59/06* (2006.01)
*H01L 51/52* (2006.01)
*C08G 59/24* (2006.01)

(56) References Cited

U.S. PATENT DOCUMENTS

| | | | |
|---|---|---|---|
| 2008/0265438 A1* | 10/2008 | Asano | C08G 59/4215 257/778 |
| 2010/0123101 A1 | 5/2010 | Ono | |
| 2010/0227949 A1* | 9/2010 | Tamai | C08F 299/00 523/400 |

* cited by examiner

SEALING RESIN COMPOSITION AND SEALING SHEET

CROSS REFERENCES TO RELATED APPLICATIONS

This application is a continuation of International Patent Application No. PCT/JP2014/079523, filed on Nov. 7, 2014, and claims priority to Japanese Patent Application No. 2013-232532, filed on Nov. 8, 2013, all of which are incorporated herein by reference in their entireties.

BACKGROUND OF THE INVENTION

Field of the Invention

The present invention relates to a sealing resin composition and a sealing sheet, particularly a sealing resin composition and a sealing sheet, which are preferable for sealing photoelectric conversion elements such as luminescence elements (e.g., organic EL (Electroluminescence) element and the like), light receiving elements (e.g., solar cell etc.), and the like, and the like.

Discussion of the Background

Organic EL (Electroluminescence) element is attracting attention in recent years, which is a luminescence element using an organic substance as a luminescence material and capable of providing high-intensity luminescence at a low voltage. However, since organic EL element is extremely weak to the moisture, the luminescence material (luminescence layer) is deteriorated by the moisture, problems occur in that the brightness decreases, luminescence is not produced, the interface between the electrode and the luminescence layer is detached due to an influence of moisture, and the metal is oxidized to be highly resistant. Therefore, to shut off the inside of the element from the moisture in the outside air, for example, the organic EL element is sealed by forming a sealing layer composed of a resin composition to cover the entire surface of a luminescence layer formed on the substrate.

A resin composition used for sealing an organic EL element is requested to have not only high barrier property (resistance to moisture permeability), but also high adhesive strength. In addition, it is requested to show high transparency when light is extracted from the sealed face (surface of sealing layer). It is conventionally proposed to add, as this kind of resin composition, particles of talc and hygroscopic metal oxides such as calcium oxide, magnesium oxide, strontium oxide, barium oxide and the like to a resin composition to realize high barrier property and high adhesive strength (e.g., patent document 1: JP-A-2011-84667). However, when such hygroscopic metal oxide is used, transparency of resin composition is impaired and high transparency cannot be achieved.

DOCUMENT LIST

Patent Documents patent document 1: JP-A-2011-84667

SUMMARY OF THE INVENTION

Problems to be Solved by the Invention

The present invention has been made in view of the above-mentioned situation, and the problem thereof to be solved is provision of a resin composition for sealing, which is superior in resistance to moisture permeability, adhesive strength and transparency.

Means of Solving the Problems

The present inventors have conducted intensive studies in an attempt to solve the aforementioned problem and found that a composition containing a hydrotalcite calcined powder, talc and silica in particular amounts relative to an epoxy resin provides a resin composition superior in all of resistance to moisture permeability, adhesive strength and transparency, which resulted in the completion of the present invention.

That is, the present invention has the following characteristics.

[1] A sealing resin composition comprising (A) at least one epoxy resin, (B) calcined hydrotalcite, (C) talc and (D) silica, wherein based on 80 parts by mass of (A) said at least one epoxy resin, said (B) is present in an amount of 3-38 parts by mass, said (C) is present in an amount of 1-16 parts by mass and said (D) is present in an amount of 1-16 parts by mass.

[2] The resin composition of the above-mentioned [1], wherein (A) said at least one epoxy resin has a transmittance of not less than 90%.

[3] The resin composition of the above-mentioned [1] or [2], further comprising (E) at least one thermoplastic resin in an amount of 1-40 parts by mass based on 80 parts by mass of (A) said at least one epoxy resin.

[4] The resin composition of the above-mentioned [3], wherein (E) said at least one thermoplastic resin is a phenoxy resin.

[5] The resin composition of the above-mentioned [3] or [4], wherein (E) said at least one thermoplastic resin has a transmittance of not less than 90%.

[6] The resin composition of any one of the above-mentioned [1]-[5], further comprising (F) at least one surface treating agent in an amount of 0.1-3 parts by mass based on 80 parts by mass of (A) said at least one epoxy resin.

[7] The resin composition of the above-mentioned [6], wherein (F) said at least one surface treating agent is a silane coupling agent.

[8] The resin composition of any one of the above-mentioned [1]-[7], which affords a cured product having a transmittance of not less than 84%.

[9] The resin composition of any one of the above-mentioned [1]-[8], further comprising (G) at least one curing agent in an amount of 0.1-3 parts by mass based on 80 parts by mass of (A) said at least one epoxy resin.

[10] The resin composition of the above-mentioned [9], wherein (G) said at least one curing agent is an ion liquid.

[11] A sealing sheet comprising a support and a layer of the resin composition of any one of the above-mentioned [1]-[10] formed on said support.

Effect of the Invention

According to the present invention, a sealing resin composition superior in all of barrier property (resistance to moisture permeability), adhesive strength and transparency can be obtained. Therefore, when the sealing resin composition of the present invention is used, for example, for sealing a luminescence element such as organic EL element and the like, a luminescence element capable of shutting off the inside of the element from the moisture in the outside air certainly and for a long term, thus stabilizing the luminescence operation for a long term, and efficiently extracting a light from the sealed face can be realized.

In addition, since the sealing resin composition of the present invention is superior in all of barrier property (resistance to moisture permeability), adhesive strength and transparency, it can also be preferably used, for example, as a sealing material for fixing a semiconductor such as silicon and the like of a solar cell sandwiched between glass and a back sheet onto a glass plate in a solar cell panel, or protecting the semiconductor from moisture, and the like. Therefore, the sealing resin composition of the present invention can be used for sealing not only a luminescence element but also a photoelectric conversion element containing a light receiving element such as solar cell and the like.

DETAILED DESCRIPTION OF THE PREFERRED EMBODIMENTS

Figure 1:
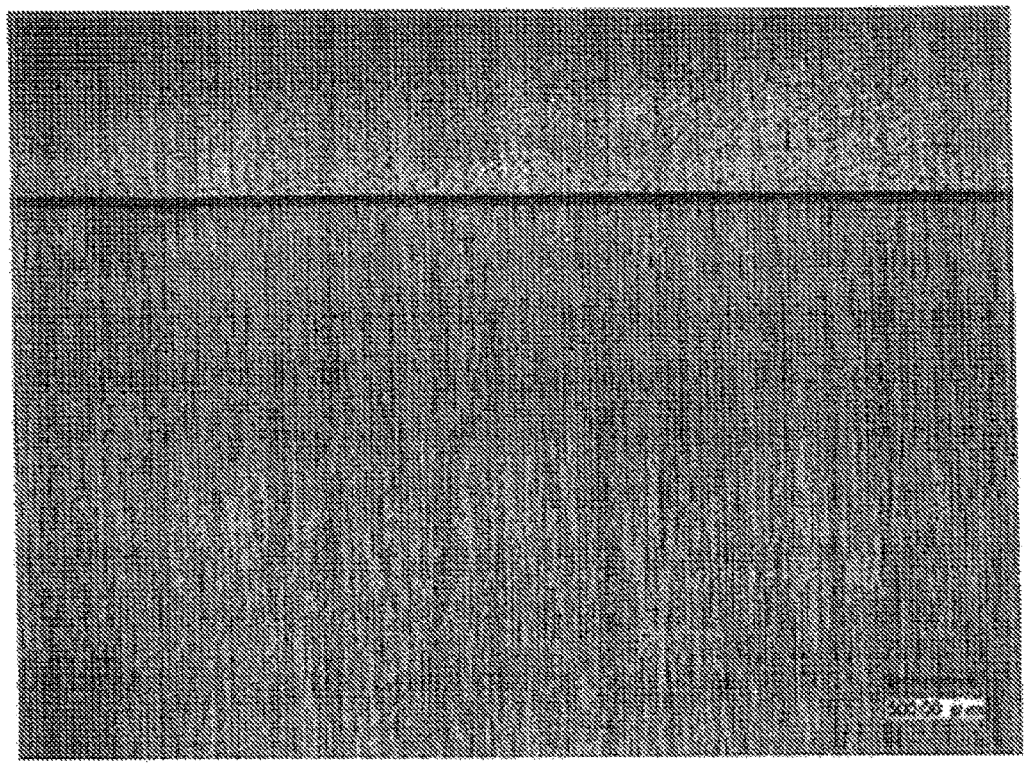
FIG. 1 is a representative photograph of a flooded area evaluated to have good resistance to moisture permeability in a moisture resistance permeability test.

The present invention is explained in detail in the following by referring to a preferable embodiment thereof.

The sealing resin composition of the present invention is mainly characterized in that it contains
(A) an epoxy resin,
(B) calcined hydrotalcite,
(C) talc and
(D) silica, wherein
based on 80 parts by mass of (A) the epoxy resin, (B) is contained at 3-38 parts by mass, (C) is contained at 1-16 parts by mass and (D) is contained at 1-16 parts by mass.
[(A) Epoxy Resin]

As an epoxy resin to be used in the present invention, any can be used without limitation as long as it has tow or more epoxy groups on average per one molecule, and has high transmittance. Examples thereof include bisphenol A type epoxy resin, biphenyl type epoxy resin, biphenylaralkyl type epoxy resin, naphthol type epoxy resin, naphthalene type epoxy resin, bisphenol F type epoxy resin, phosphorus containing epoxy resin, bisphenol S type epoxy resin, aromatic glycidyl amine type epoxy resin (e.g., tetraglycidyl diaminodiphenylmethane, triglycidyl-p-aminophenol, diglycidyl toluidine, diglycidyl aniline etc.), alicyclic epoxy resin, aliphatic chain epoxy resin, phenol novolac type epoxy resin, cresol novolac type epoxy resin, bisphenol A novolac type epoxy resin, epoxy resin having a butadiene structure, diglycidyl etherified bisphenol, diglycidyl etherified naphthalenediol, glycidyl etherified phenols, and diglycidyl etherified alcohols, as well as alkyl substituted product, halide and hydrogenated product of these epoxy resins and the like. Any one kind of such epoxy resins may be used or a mixture of two or more kinds thereof can be used. In the present invention, an epoxy resin having a weight average molecular weight of less than 15000 can be used.

Of these, an epoxy resin preferably having a transmittance of not less than 80%, more preferably not less than 85%, particularly preferably not less than 90%, is used. Examples of such preferable epoxy resin include bisphenol A type epoxy resin, bisphenol F type epoxy resin, phenol novolac type epoxy resin, biphenylaralkyl type epoxy resin, alicyclic epoxy resin, aliphatic chain epoxy resin and the like.

The transmittance in the present invention refers to the total light transmittance, which is a light transmittance measured for the purpose of examining the level of brightness that permeates materials while taking reflection and scattering into consideration. It is measured by a method including collecting the permeated light by using an integrating sphere while utilizing visible light and ultraviolet light as the incident light. To be specific, using a fiber type spectrophotometer (e.g., MCPD-7700, manufactured by OTSUKA ELECTRONICS Co., LTD.), the incident light from a halogen lamp is irradiated on a sample (insulating layer thickness 20 μm), and the value at 450 nm of the total light transmittance spectrum harvested by a 8° floodlighting φ60 mm integrating sphere, which is measured using air as the reference, can be used as the transmittance in the present invention.

As described in detail below, the resin composition of the present invention is used in an embodiment wherein it is directly coated on a sealing target, and the coated film thereof is cured to form a sealing layer, as well as an embodiment wherein a sealing sheet is produced by mixing the resin composition of the present invention with a solvent to give a varnish, applying the varnish on a support, and drying same to form a layer of the resin composition of the present invention, and the sealing sheet is laminated on a sealing target.

The epoxy resin may be in a liquid state or a solid state, or both liquid and solid may be used. Here, the "liquid state" and "solid state" are the states of the epoxy resin at room temperature (25° C.). From the aspects of coatability, processability and adhesiveness, at least not less than 10 mass % of the whole epoxy resin to be used is preferably liquid.

From the aspects of reactivity, the epoxy resin preferably has an epoxy equivalent within the range of 100-1000 g/eq, more preferably 120-1000 g/eq, further preferably 150-1000 g/eq. The "epoxy equivalent" is the number of grams (g/eq) of the resin containing 1 gram equivalent of an epoxy group, which is measured according to the method defined in JIS K 7236.

The content of the epoxy resin in the resin composition of the present invention is preferably 20-80 mass %, more preferably 30-70 mass %, further preferably 50-65 mass %, of the whole resin composition (non-volatile content).
[(B) Calcined Hydrotalcite]

The resin composition of the present invention contains calcined hydrotalcite.

Calcined hydrotalcite is obtained by calcining natural hydrotalcite ($Mg_6Al_2(OH)_{16}CO_3 \cdot 4H_2O$) and/or synthetic hydrotalcite (hydrotalcite-like compound). Examples of the synthetic hydrotalcite (hydrotalcite-like compound) include double hydroxide represented by the following formula (I), double hydroxide represented by the following formula (II) and the like.

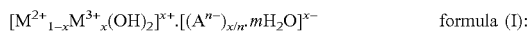

$$[M^{2+}{}_{1-x}M^{3+}{}_x(OH)_2]^{x+} \cdot [(A^{n-})_{x/n} \cdot mH_2O]^{x-} \qquad \text{formula (I):}$$

wherein $M^{2+}$ is a divalent metal ion such as $Mg^{2+}$, $Zn^{2+}$ and the like, $M^{3+}$ is a trivalent metal ion such as $Al^{3+}$, $Fe^{3+}$ and the like, $A^{n-}$ is an n valent anion such as $CO_3^{2-}$, $Cl^-$, $NO_3^-$ and the like, 0<x<1, 0≤m<1, and n is a positive number.

  formula (II):

wherein $M^{2+}$ is a divalent metal ion such as $Mg^{2+}$, $Zn^{2+}$ and the like, $A^{n-}$ is an n valent anion such as $CO_3^{2-}$, $Cl^-$, $NO_3^-$ and the like, x is a positive number of two or more, z is a positive number of two or below, m is a positive number, and n is a positive number.

That is, "calcined hydrotalcite" is a composite oxide obtained by calcining natural hydrotalcite ($Mg_6Al_2(OH)_{16}CO_3$ $4H_2O$) and/or synthetic hydrotalcite (hydrotalcite-like compound) to vaporize anion and water molecule between layers and is, for example, a composite oxide obtained by calcining at preferably 400-900° C., more preferably 500-700° C., for 30 min-5 hr, more preferably 30 min-3 hr, further preferably 45 min-2 hr.

A preferable calcined hydrotalcite is an Mg—Al composite oxide obtained by calcining an Mg—Al hydrotalcite-like compound such as a double hydroxide of the above-mentioned formula (II) and the like. As the Mg—Al composite oxide, a composite oxide m having a composition ratio of Mg and Al of Mg:Al=x:2 wherein x is 2≤x≤6 is more preferable, a composite oxide having a composition ratio wherein x is 3≤x≤6 is further preferable, and a composite oxide having a composition ratio wherein x is 4≤x≤6 is particularly preferable.

As calcined hydrotalcite used in the present invention, one having a small particle size is preferably used from the aspects of the transparency and hygroscopicity of a resin composition. Generally, it is considered that calcined hydrotalcite in a powder state contains many secondary particles wherein primary particles are coagulated. Since the measurement of average particle size of primary particles is comparatively difficult, calcined hydrotalcite more preferable for the present invention can be obtained by setting the BET specific surface area to a predetermined value. Preferable BET specific surface area is 5-200 $m^2/g$, more preferably 10-150 $m^2/g$.

The BET specific surface area can be obtained by adsorbing nitrogen gas to the sample surface according to the BET method and using a specific surface area measuring apparatus (Macsorb HM Model-1210 manufactured by MOUNTECH Co., Ltd.), and calculating the specific surface area by the BET multipoint method. The BET specific surface area of calcined hydrotalcite can be adjusted by pulverizing and classifying hydrotalcite before calcination, or pulverizing and classifying hydrotalcite calcine (calcined hydrotalcite), or combining the both.

Since calcined hydrotalcite becomes porous by calcination, the incident light in the resin composition shows higher scattering property due to the presence of calcined hydrotalcite and advantageously acts due to improved transparency.

In the resin composition of the present invention, the content of the (B) calcined hydrotalcite is 3-38 parts by mass based on 80 parts by mass (A) the epoxy resin. From the aspects of the resistance to moisture permeability and transparency, it is preferably 5-35 parts by mass, more preferably 10-35 parts by mass. When the amount is too small, the resistance to moisture permeability tends to decrease, and the transmittance tends to decrease.

The content of the (B) calcined hydrotalcite is preferably 2-24 mass %, more preferably 5-23 mass %, of the whole resin composition (non-volatile content).

[(C) Talc]

The resin composition of the present invention contains talc. Talc contributes to the improvement of particularly the adhesive strength of the resin composition, and can greatly improve the adhesive strength of the resin composition with a small amount of addition. From the aspect of the adhesive strength and transmittance, the average particle size of talc is preferably 0.5-2 μm, more preferably 0.8-1.5 μm.

The average particle size of talc can be measured by the laser diffraction scattering method based on the Mie scattering theory. To be specific, it can be measured by forming the particle size distribution of the inorganic filler based on the volume standard by a laser diffraction scattering particle size distribution analyzer, and obtaining the average particle size of the median size thereof. A measurement sample obtained by dispersing an inorganic filler in water by ultrasonication can be preferably used. As the laser diffraction scattering particle size distribution analyzer, LA-500 manufactured by Horiba, Ltd. and the like can be used.

In the resin composition of the present invention, the content of the (C) talc is 1-16 parts by mass based on 80 parts by mass of (A) the epoxy resin. Particularly, to maintain the adhesive strength and transmittance of a resin composition at a high level, it is preferably 1-10 parts by mass, more preferably 2-8 parts by mass. When the amount of talc is too small, the adhesive strength tends to decrease, and when it is too high, the transmittance tends to decrease.

The content of (C) talc is preferably 0.5-12 mass %, more preferably 1.0-11 mass %, of the whole resin composition (non-volatile content).

[(D) Silica]

The resin composition of the present invention contains silica. Silica contributes to the improvement of particularly the resistance to moisture permeability and transmittance of the resin composition, and can improve the resistance to moisture permeability and transmittance with a small amount of addition, without lowering the adhesive strength of the resin composition. As silica, one having a particle size of primary particles of a nano order, what is called, nano silica, is preferable. Silica having a particle size of primary particles of 1-100 nm is more preferable, and 1-50 nm is more preferable, 10-20 nm is more preferable, and 10-15 nm is more preferable. Since the particle size of primary particles of nano silica is comparatively difficult to measure, a value converted from the measured value of a specific surface area (according to JIS 28830) is sometimes used. Also in silica preferable for the present invention, silica more preferable for the present invention can be obtained by setting the BET specific surface area to a given value. A preferable BET specific surface area is 2720-27 $m^2/g$, more preferably 2720-54 $m^2/g$, more preferably 272-136 $m^2/g$, more preferably 272-181 $m^2/g$.

As silica, any of wet silica, dry silica, colloidal silica (water dispersion type, organic solvent dispersion type, gas phase silica etc.) and the like can be used. Since precipitation and sediment formation do not occur easily and a composite with a resin is easily formed, colloidal silica is preferable, and organic solvent dispersing type colloidal silica (organosilica sol) is particularly preferable. Specifically, SNOWTEX-C, SNOWTEX-O, SNOWTEX-N, SNOWTEX-S, SNOWTEX-OL, SNOWTEX-XS, SNOWTEX-XL, MP1040 and the like manufactured by NISSAN CHEMICAL INDUSTRIES, LTD. can be used as spherical colloidal silica, and IPA-ST, MEK-ST, IPA-ST-ZL and the like of a general grade, as well as MEK-EC, MEK-AC, PGM-AC and the like of a surface-modified grade can be used as organosilica sol dispersed in organic solvent. SNOWTEX-UP, SNOWTEX-OUP and the like manufactured by NIS- SAN CHEMICAL INDUSTRIES, LTD. can be used as chain colloidal silica, and IPA-ST-UP and the like can be used as organosilica sol. AEROSIL 130, AEROSIL 200, AEROSIL 200CF, AEROSIL 300, AEROSIL 300CF, AEROSIL 380, AEROSIL MOX80 and the like manufactured by NIPPON AEROSIL CO., LTD. can be used as gas phase silica.

In the resin composition of the present invention, the content of the (D) silica is 1-16 parts by mass based on 80 parts by mass of (A) the epoxy resin. Particularly, to maintain the adhesive strength and transmittance of a resin composition at a high level, it is preferably 1-14 parts by mass, more preferably 5-12 parts by mass.

The content of (D) silica is preferably 0.5-10 mass %, more preferably 1.0-9 mass %, of the whole resin composition (non-volatile content).

The resin composition of the present invention can contain an inorganic filler other than hydrotalcite, talc and silica within the range the effect of the present invention is not inhibited, from the aspects of the resistance to moisture permeability of the resin composition, coatability (prevention of cissing) of a resin composition varnish in the preparation of a sealing sheet and the like. Examples of the inorganic filler include alumina, barium sulfate, clay, mica, aluminum hydroxide, magnesium hydroxide, calcium carbonate, magnesium carbonate, boron nitride, aluminum borate, barium titanate, strontium titanate, calcium titanate, magnesium titanate, bismuth titanate, titanium oxide, barium zirconate, calcium zirconate and the like. One or more kinds of the inorganic filler can be used.

When the resin composition of the present invention contains an inorganic filler, the content of the inorganic filler is preferably not more than 30 mass %, more preferably not more than 20 mass %, of the whole resin composition (non-volatile content).

[(E) Thermoplastic Resin]

The resin composition of the present invention can contain a thermoplastic resin to impart flexibility to a sealing layer obtained by curing a resin composition, and in view of the coatability (prevention of repelling) of a resin composition varnish in the preparation of a sealing sheet and the like. Examples of the thermoplastic resin include phenoxy resin, polyvinyl acetal resin, polyimide resin, polyamideimide resin, polyether sulfone resin, polysulfone resin and the like. Any one kind of these thermoplastic resins may be used or a mixture of two or more kinds thereof may also be used. To impart flexibility to a sealing layer obtained by curing a resin composition, and in view of the coatability (prevention of repelling) of a resin composition varnish in the preparation of a sealing sheet and the like, the thermoplastic resin preferably has a weight average molecular weight of not less than 15,000, more preferably not less than 20,000. When the weight average molecular weight is too high, the compatibility with epoxy resin tends to decrease, and the like. Therefore, the weight average molecular weight is preferably not more than 1,000,000, more preferably not more than 800,000.

The "weight average molecular weight of the thermoplastic resin" here is measured by gel permeation chromatography (GPC) method (based on polystyrene). Specifically, the weight average molecular weight can be measured by the GPC method using LC-9A/RID-6A manufactured by SHIMADZU CORPORATION as a measuring apparatus, Shodex K-800P/K-804L/K-804L manufactured by Showa Denko K.K. as a column, and chloroform and the like as a mobile phase at a column temperature of 40° C., and calculated using the analytical curve of standard polystyrene.

The thermoplastic resin preferably has a transmittance of not less than 80%, more preferably not less than 90%.

Of those mentioned above, the thermoplastic resin is particularly preferably a phenoxy resin. The phenoxy resin has good compatibility with an epoxy resin, and advantageously acts on the transparency and resistance to moisture permeability of a resin composition.

As the phenoxy resin, a phenoxy resin having one or more kinds of skeleton selected from bisphenol A skeleton, bisphenol F skeleton, bisphenol S skeleton, bisphenol acetophenone skeleton, novolac skeleton, biphenyl skeleton, fluorene skeleton, dicyclopentadiene skeleton, norbornene skeleton and the like can be mentioned. One or more kinds of phenoxy resin can be used.

As a commercially available product of the phenoxy resin, YL7213B35 (biphenyl skeleton containing phenoxy resin), 1256 (bisphenol A skeleton containing phenoxy resin), YX6954BH35 (bisphenol acetophenone skeleton containing phenoxy resin) and the like manufactured by Mitsubishi Chemical Corporation can be preferably used.

In the resin composition of the present invention, the content of the thermoplastic resin is preferably 1-40 mass %, more preferably 5-30 mass %, of the whole resin composition (non-volatile content).

[(F) Surface Treating Agent]

The resin composition of the present invention can contain a surface treating agent to improve the adhesive strength of the resin composition. Examples of such surface treating agent include coupling agents such as titanium coupling agent, aluminum coupling agent, silane coupling agent and the like. Of the coupling agents, a silane coupling agent is preferable. One or more kinds of the coupling agent can be used in combination.

Examples of the silane coupling agent include epoxy silane coupling agents such as 3-glycidyloxypropyltrimethoxysilane, 3-glycidyloxypropyltriethoxysilane, 3-glycidyloxypropyl(dimethoxy)methylsilane and 2-(3,4-epoxycyclohexyl)ethyltrimethoxysilane and the like; mercapto silane coupling agents such as 3-mercaptopropyltrimethoxysilane, 3-mercaptopropyltriethoxysilane, 3-mercaptopropylmethyldimethoxysilane and 11-mercaptoundecyltrimethoxysilane and the like; amino silane coupling agents such as 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane and N-(2-aminoethyl)-3-aminopropyldimethoxymethylsilane and the like; ureido silane coupling agents such as 3-ureidopropyltriethoxysilane and the like; vinyl silane coupling agents such as vinyltrimethoxysilane, vinyltriethoxysilane and vinylmethyldiethoxysilane and the like; styryl silane coupling agents such as p-styryltrimethoxysilane and the like; acrylate silane coupling agents such as 3-acryloxypropyltrimethoxysilane and 3-methacryloxypropyltrimethoxysilane and the like; isocyanate silane coupling agents such as 3-isocyanatopropyltrimethoxysilane and the like; sulfide silane coupling agents such as bis(triethoxysilylpropyl)disulfide, bis(triethoxysilylpropyl)tetrasulfide and the like; and phenyltrimethoxysilane, methacryloxypropyltrimethoxysilane, imidazole silane, triazine silane and the like. Of these, an epoxy silane coupling agent is particularly preferable.

In the resin composition of the present invention, when a surface treating agent is used, the content of the surface treating agent is preferably 0.5-10 mass %, more preferably 0.5-5 mass %, of the whole resin composition (non-volatile content). When it is contained outside this range, an adhesion-improving effect by the addition of a surface treating agent cannot be obtained.

Calcined hydrotalcite, talc, silica, and other inorganic fillers to be used in the present invention may be surface-treated with surface treating agents to improve dispersibility and the like.

[Rubber Particles]

The resin composition of the present invention may contain rubber particles for the purpose of improving mechanical strength to a sealing layer obtained by curing a resin composition, stress relaxation of the sealing layer and the like. As the rubber particle, one that does not dissolve in an organic solvent used for preparing a resin composition, is incompatible with the components in the resin composition such as epoxy resin and the like, and is present in a dispersion state in a varnish of the resin composition is preferable. Such rubber particles can be generally prepared by increasing the molecular weight of the rubber component to a level not permitting dissolution in an organic solvent or resin and converting to particles. Specific examples thereof include core shell type rubber particles, crosslinking acrylonitrile butadiene rubber particles, crosslinking styrene butadiene rubber particles, acrylic rubber particles and the like. Core shell type rubber particles are rubber particles wherein particles have a core layer and a shell layer, and examples thereof include rubber particles having a 2 layer structure wherein the shell layer of the outer layer is a glassy polymer, and the core layer of the inner layer is a rubbery polymer, and a 3 layer structure wherein the shell layer of the outer layer is a glassy polymer, the intermediate layer is a rubbery polymer, and the core layer is a glassy polymer, and the like. The glass layer is constituted of, for example, a polymer substance of methyl methacrylate and the like, and the rubbery polymer layer is constituted of, for example, a polymer substance of butyl acrylate (butyl rubber) and the like. Specific examples of the core shell type rubber particles include Staphyloid AC3832, AC3816N (all manufactured by Ganz Chemical Co., LTD., METABLEN KW-4426 (manufactured by MITSUBISHI RAYON CO., LTD.), F351 (manufactured by ZEON CORPORATION) and the like. Specific examples of the acrylonitrile butadiene rubber (NBR) particles include XER-91 (manufactured by JSR) and the like. Specific examples of the styrene butadiene rubber (SBR) particles include XSK-500 (manufactured by JSR) and the like. Specific examples of the acrylic rubber particles include METABLEN W300A, W450A (all manufactured by MITSUBISHI RAYON CO., LTD.).

The average particle size of the rubber particles is preferably 0.005-1 μm, more preferably 0.2-0.6 μm. The average particle size of such rubber particles can be measured by a dynamic light scattering method. For example, rubber particles are uniformly dispersed in a suitable organic solvent by ultrasonication and the like, the particle size distribution of the rubber particles is formed on the mass standard by using FPRA-1000 (manufactured by OTSUKA ELECTRONICS Co., LTD), and the median diameter thereof is taken as an average particle size.

In the resin composition of the present invention, when rubber particles are used, the content of the rubber particles is preferably 0.1-20 mass %, more preferably 0.1-10 mass %, of the whole resin composition (non-volatile content). When it is less than 0.1 mass %, the effect of the addition of rubber particles is not sufficiently obtained, and when it is higher than 20 mass %, heat resistance and resistance to moisture permeability sometimes decrease.

[(G) Curing Agent]

The resin composition of the present invention generally contains a curing agent for an epoxy resin. That is, a sealing layer is obtained as a cured product layer obtained by curing a resin composition layer. The curing agent is not particularly limited as long as it has a function to cure an epoxy resin, and one capable of curing an epoxy resin at not more than 140° C. (preferably not more than 120° C.) is preferable from the aspect of suppression of thermal degradation of a luminescence element such as organic EL element and the like at the time of a curing treatment of a resin composition.

For example, primary amine, secondary amine, tertiary amine curing agent, polyaminoamide curing agent, dicyandiamide, organic acid dihydrazide and the like can be mentioned. Of these, amine adduct compound (AJICURE PN-23, AJICURE MY-24, AJICURE PN-D, AJICURE MY-D, AJICURE PN-H, AJICURE MY-H, AJICURE PN-31, AJICURE PN-40, AJICURE PN-40J etc. (all manufactured by Ajinomoto Fine-Techno Co., Inc.)), organic acid dihydrazide (AJICURE VDH-J, AJICURE UDH, AJICURE LDH etc. (all manufactured by Ajinomoto Fine-Techno Co., Inc.)) and the like are particularly preferable from the aspect of rapid curability.

An ion liquid capable of curing an epoxy resin at a temperature of not more than 140° C. (preferably not more than 120° C.), that is, a salt capable of fusing in a temperature range of not more than 140° C. (preferably not more than 120° C.) and having an epoxy resin-curing action, can also be used particularly preferably as (G) curing agent. In the resin composition of the present invention, an epoxy resin wherein the ion liquid is uniformly dissolved is desirably used, and the ion liquid advantageously acts on the improvement of resistance to moisture permeability of a resin cured product.

Examples of the cation constituting such ion liquid include ammonium cations such as imidazolium ion, piperidinium ion, pyrrolidinium ion, pyrazonium ion, guanidinium ion, pyridinium ion and the like; phosphonium cations such as tetraalkylphosphonium cation (e.g., tetrabutylphosphonium ion, tributylhexylphosphonium ion etc.) and the like; sulfonium cations such as triethylsulfonium ion and the like, and the like.

Examples of the anion constituting such ion liquid include halide anions such as fluoride ion, chloride ion, bromide ion, iodide ion and the like; alkylsulfate anions such as methanesulfonate ion and the like; fluorine-containing compound anions such as trifluoromethanesulfonate ion, hexafluorophosphonate ion, trifluorotris(pentafluoroethyl)phosphonate ion, bis(trifluoromethanesulfonyl)imide ion, trifluoroacetate ion, tetrafluoroborate ion and the like; phenolate anions such as phenolate ion, 2-methoxyphenolate ion, 2,6-di-tert-butylphenolate ion and the like; acidic amino acid ions such as aspartate ion, glutamate ion and the like; neutral amino acid ions such as glycinate ion, alaninate ion, phenylalaninate ion and the like; N-acylamino acid ions represented by the following general formula (1) such as N-benzoylalaninate ion, N-acetylphenylalaninate ion, N-acetylglycinate ion and the like; and carboxylate anions such as formate ion, acetate ion, decanoate ion, 2-pyrrolidone-5-carboxylate ion, α-lipoate ion, lactate ion, tartrate ion, hippurate ion, N-methylhippurate ion, benzoate ion and the like.

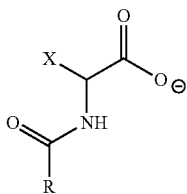

(1)

wherein R—CO— is an acyl group derived from a straight chain or branched chain fatty acid having 1-5 carbon atoms, or a substituted or unsubstituted benzoyl group, and X is a side chain of amino acid.

Examples of the amino acid in the formula (1) include aspartic acid, glutamic acid, glycine, alanine, phenylalanine and the like, with preference given to glycine.

Of those mentioned above, cation is preferably ammonium cation or phosphonium cation, more preferably imidazolium ion or phosphonium ion. The imidazolium ion is more particularly 1-ethyl-3-methylimidazolium ion, 1-butyl-3-methylimidazolium ion, 1-propyl-3-methylimidazolium ion or the like.

The anion is preferably phenolate anion, N-acylamino acid ion represented by the general formula (1) or carboxylate anion, more preferably N-acylamino acid ion or carboxylate anion.

Specific examples of the phenolate anion include 2,6-di-tert-butylphenolate ion. Specific examples of the carboxylate anion include acetate ion, decanoate ion, 2-pyrrolidone-5-carboxylate ion, formate ion, α-lipoate ion, lactate ion, tartrate ion, hippurate ion, N-methylhippurate ion and the like, and acetate ion, 2-pyrrolidone-5-carboxylate ion, formate ion, lactate ion, tartrate ion, hippurate ion, and N-methylhippurate ion are preferable and acetate ion, N-methylhippurate ion, and formate ion are particularly preferable. Specific examples of the N-acylamino acid ion represented by the general formula (1) include N-benzoylalaninate ion, N-acetylphenylalaninate ion, aspartate ion, glycinate ion, N-acetylglycinate ion and the like and, of these, N-benzoylalaninate ion, N-acetylphenylalaninate ion, and N-acetylglycinate ion are preferable and N-acetylglycinate ion is particularly preferable.

Specific preferable examples of the ion liquid include 1-butyl-3-methylimidazolium lactate, tetrabutylphosphonium-2-pyrrolidone-5-carboxylate, tetrabutylphosphonium acetate, tetrabutylphosphonium decanoate, tetrabutylphosphonium trifluoroacetate, tetrabutylphosphonium α-lipoate, tetrabutylphosphonium formate, tetrabutylphosphonium lactate, bis(tetrabutylphosphonium) tartrate, tetrabutylphosphonium hippurate, tetrabutylphosphonium N-methylhippurate, tetrabutylphosphonium benzoyl-DL-alaninate, tetrabutylphosphonium N-acetylphenylalaninate, tetrabutylphosphonium 2,6-di-tert-butylphenolate, monotetrabutylphosphonium L-aspartate, tetrabutylphosphonium glycinate, tetrabutylphosphonium N-acetylglycinate, 1-ethyl-3-methylimidazolium lactate, 1-ethyl-3-methylimidazolium acetate, 1-ethyl-3-methylimidazolium formate, 1-ethyl-3-methylimidazolium hippurate, 1-ethyl-3-methylimidazolium N-methylhippurate, bis(1-ethyl-3-methylimidazolium) tartrate, and 1-ethyl-3-methylimidazolium N-acetylglycinate, and tetrabutylphosphonium N-acetylglycinate, 1-ethyl-3-methylimidazolium acetate, 1-ethyl-3-methylimidazolium formate, 1-ethyl-3-methylimidazolium hippurate, and 1-ethyl-3-methylimidazolium N-methylhippurate are particularly preferable.

Examples of the synthesis method of the above-mentioned ion liquid include, but are not limited to, an anion exchange method comprising reacting a precursor constituted of a cation moiety such as alkylimidazolium, alkylpyridinium, alkylammonium, alkylsulfonium ion and the like and an anion moiety containing halogen with $NaBF_4$, $NaPF_6$, $CF_3SO_3Na$, $LiN(SO_2CF_3)_2$ and the like, an acid ester method comprising converting an organic acid residue to a counter anion while introducing an alkyl group by reacting an amine substance and an acid ester, a neutralization method comprising neutralizing amines with an organic acid to give a salt and the like. In the neutralization method using an anion, a cation and a solvent, equal amounts of the anion and cation are used, the solvent in the obtained reaction mixture is evaporated and the residue can be used as it is, or may be evaporated with adding an organic solvent (methanol, toluene, ethyl acetate, acetone etc.).

In the resin composition of the present invention, as the content of the curing agent, it is preferably used within the range of 0.1-50 mass % relative to the total amount of the epoxy resin (non-volatile content) contained in the resin composition. When it is smaller than this range, sufficient curability may not be achieved, and when it is higher than 50 mass %, the preservation stability of the resin composition may be impaired. When an ion liquid is used, 0.1-10 mass % is preferable relative to the total amount of the epoxy resin (non-volatile content) from the aspects of the resistance to moisture permeability and the like of a cured product of the resin composition.

When an ion liquid is used as a curing agent for the resin composition of the present invention, a polythiol compound containing two or more thiol groups in a molecule may be contained along with the ion liquid. By containing a polythiol compound containing two or more thiol groups in a molecule, the curing rate can be accelerated. Specific examples of the polythiol compound containing two or more thiol groups in a molecule include thiol compounds obtained by an esterification reaction of polyols such as trimethylolpropane tris(thioglycolate), pentaerythritol tetrakis(thioglycolate), ethylene glycol dithioglycolate, trimethylolpropane tris(β-thiopropionate), pentaerythritol tetrakis(β-thiopropionate), dipentaerythritol poly(β-thiopropionate) and the like and a mercapto organic acid. Such thiol compound is a thiol compound having two or more thiol groups in a molecule, which does not require use of a basic substance for the production.

Examples of the polythiol compound having two or more thiol groups in a molecule include alkylpolythiol compounds such as 1,4-butanedithiol, 1,6-hexanedithiol, 1,10-decanedithiol and the like; terminal thiol group containing polyether; terminal thiol group containing polythioether; thiol compound obtained by reacting epoxy compound with hydrogen sulfide; thiol compound having a terminal thiol group which is obtained by reacting polythiol compound with epoxy compound and the like. When a basic substance is used as a reaction catalyst in the production step of the thiol compound obtained by reacting epoxy compound with hydrogen sulfide, the thiol compound having a terminal thiol group which is obtained by reacting polythiol compound with epoxy compound and the like, one subjected to a dealkalization treatment to set the alkali metal ion concentration to not more than 50 ppm is preferably used. Examples of the method of such dealkalization treatment include, but are not limited to, a method including dissolving a polythiol compound to be treated in an organic solvent such as acetone, methanol and the like, neutralizing same by adding an acid such as dilute hydrochloric acid, dilute sulfuric acid and the like, and desalting same by extraction, washing and the like, a method including adsorbing using an ion exchange resin, a method including purifying by distillation and the like.

When such polythiol compound is used in the resin composition of the present invention, the mixing ratio of an epoxy resin and a polythiol compound (SH equivalent number/epoxy equivalent number) is generally preferably 0.2-1.2. When it is less than 0.2, sufficient rapid curability cannot be achieved sometimes, and when it exceeds 1.2, the property of the cured product such as heat resistance and the like is sometimes impaired. It is more preferably 0.5-1.0 from the aspect of stabilized adhesiveness.

[(H) Curing Accelerator]

The resin composition of the present invention may contain a curing accelerator to adjust the curing time and the like. Examples of the curing accelerator include organic phosphine compound, imidazole compound, amine adduct compound (e.g., epoxy adduct compound wherein the reaction is stopped on its way by adding tertiary amine to an epoxy resin etc.), tertiary amine compound and the like. Specific examples of the organic phosphine compound include TPP, TPP-K, TPP-S, TPTP-S (HOKKO CHEMICAK INDUSTRY CO., LTD. trade name) and the like. Specific examples of the imidazole compound include CUREZOL 2 MZ, 2E4 MZ, C11Z, C11Z-CN, C11Z-CNS, C11Z-A, 2 MZOK, 2 MA-OK, 2 PHZ (SHIKOKU CHEMICALS CORPORATION trade name) and the like. Specific examples of the amine adduct compound include FUJI-CURE (Fuji Chemical Industry Co., Ltd. trade name) and the like. Specific examples of the tertiary amine compound include DBU (1,8-diazabicyelo[5.4.0]undec-7-ene), DBU-organic acid salts such as DBU 2-ethylhexanoate, octylate and the like, aromatic dimethylurea such as U-3512T (manufactured by San-Apro Ltd.) and the like, aliphatic dimethylurea such as U-3503N (manufactured by San-Apro Ltd.) and the like, and the like. Of these, a urea compound is preferable, aromatic dimethylurea is particularly preferably used from the aspect of moisture resistance. In the resin composition of the present invention, the content of the curing accelerator is generally 0.05-5 mass % when the total amount of the epoxy resin in the resin composition is 100 mass % (non-volatile content). When the content is less than 0.05 mass %, curing becomes slow and the thermosetting time tends to be longer, and when it exceeds 5 mass %, the preservation stability of the resin composition tends to decrease.

The resin composition of the present invention may contain various resin additives other than the aforementioned components as long as the effect of the present invention is exhibited. Examples of such resin additive include organic fillers such as silicone powder, nylon powder, fluorine powder and the like; thickeners such as Orben, Benton, and the like; silicone-based, fluorine-based, polymer-based antifoaming agents or leveling agents; adhesion-imparting agents such as triazole compound, thiazole compound, triazine compound, porphyrin compound and the like; and the like.

The resin composition of the present invention is prepared by mixing the blending components, after adding a solvent and the like where necessary, by a kneading roller, a rotary mixer, etc. and the like can be mentioned.

The resin composition of the present invention has high transmittance, and the sealing layer formed (i.e., cured product of the resin composition) has transmittance of preferably not less than 84%, more preferably not less than 86%.

A sealing layer can be formed by directly applying the resin composition of the present invention to a sealing target and curing the coated film. A sealing layer can also be formed by producing a sealing sheet wherein a layer of the resin composition of the present invention is formed on a support, laminating the sealing sheet on the necessary part(s) on the sealing target to transfer the resin composition layer to the coating target, and curing same.

A sealing sheet can be produced by a method known to those of ordinary skill in the art by, for example, dissolving the resin composition in an organic solvent to prepare varnish, applying the varnish on a support, and further drying the organic solvent by heating, blowing hot air thereto and the like to form a resin composition layer.

Examples of the support to be used for the sealing sheet include a plastic film of polyolefin such as polyethylene, polypropylene, polyvinyl chloride and the like, polyester such as poly(ethylene terephthalate) (hereinafter sometimes to be referred to as "PET"), poly(ethylene naphthalate) and the like, polycarbonate, polyimide and the like. As the plastic film, PET is particularly preferable. The support may be previously subjected to a matte treatment, a corona treatment as well as a mold release treatment. Examples of the mold release treatment include a mold release treatment using a mold release agent such as a silicone resin mold release agent, an alkyd resin mold release agent, a fluorine resin mold release agent and the like.

While the thickness of the support is not particularly limited, it is generally 10-150 μm, preferably 20-100 μm, from the aspects of handling property and the like of the resin composition sheet.

Examples of the organic solvent include ketones such as acetone, methyl ethyl ketone (hereinafter to be also abbreviated as "MEK"), cyclohexanone and the like; acetic acid esters such as ethyl acetate, butyl acetate, cellosolve acetate, propylene glycol monomethyl ether acetate, Carbitol acetate and the like; Carbitols such as cellosolve, butyl carbitol and the like; aromatic hydrocarbons such as toluene, xylene and the like; dimethylformamide, dimethylacetamide, N-methylpyrrolidone and the like. Any one kind of such organic solvents may be used or a mixture of two or more kinds thereof may also be used.

While the drying condition is not particularly limited, generally about 50-100° C. for about 3-15 min is preferable.

The thickness of the resin composition layer formed after drying is generally 3 μm-200 μm, preferably 5 μm-100 μm, more preferably 5 μm-50 μm.

The resin composition layer may be protected with a protection film and, by protecting with a protection film, attachment of dirt and the like to the surface of the resin composition layer and scar thereof can be prevented. As the protection film, a plastic film similar to the support is preferably used. The protection film may also be previously subjected to a matte treatment, a corona treatment as well as a mold release treatment. While the thickness of the protection film is not particularly limited, it is generally 1-150 μm, preferably 10-100 μm.

As a sealing sheet, a sealed structure provided with high resistance to moisture-proof property and high transparency can be formed by using a support having moisture-proof property and high transmittance as a support, laminating the sealing sheet on the necessary part(s) on a sealing target, and directly curing the resin composition layer to form a sealing layer. Examples of such support having moisture-proof property and high transmittance include plastic films having an inorganic substance such as silicon oxide (silica), silicon nitride, SiCN, amorphous silicon and the like, which is vapor deposited on the surface and the like. Here, as the plastic film, plastic films of polyolefin (e.g., polyethylene, polypropylene, polyvinyl chloride etc.), polyester (e.g., poly (ethylene terephthalate), poly(ethylene naphthalate) etc.), polycarbonate, polyimide and the like can be used. As the plastic film, a PET film is particularly preferable. Examples of the commercially available plastic film having moisture-proof property include TECHBARRIER HX, AX, LX and L series (manufactured by Mitsubishi Plastics, Inc.), X-BARRIER having further enhanced moisture-proof effect (manufactured by Mitsubishi Plastics, Inc.) and the like. As a sealing substrate, one having a multilayer structure of two or more layers may be used.

In a sealing sheet, when the resin composition layer is protected with a protection film, it is detached, and a sealing sheet is laminated such that the resin composition layer directly contacts the sealing target (e.g., organic EL element etc.). A method of lamination may be of a batch type or continuous type using a roll. After lamination, the support is detached, and the below-mentioned thermosetting operation of the resin composition layer is performed. When the support of the sealing sheet has moisture-proof property, a sealing sheet is laminated, and the below-mentioned thermosetting operation of the resin composition layer is performed without detaching the support.

The resin composition layer is generally cured by thermosetting. For example, heating by hot air circulating oven, infrared heater, heat gun, high frequency induction heating apparatus, or heating by pressing with a heat tool and the like can be mentioned. As the lower limit values of the curing temperature and the curing time, the curing temperature is preferably not less than 50° C., more preferably not less than 55° C., and the curing time is preferably not less than 20 min, more preferably not less than 30 min, to adhere a resin composition layer (sealing layer) after curing to a sealing target with a sufficiently satisfactory adhesive strength.

EXAMPLES

While the present invention is explained in more detail in the following by referring to Examples and Comparative Examples, the present invention is not limited at all by the following Examples.

The materials (starting materials) used in the Examples and Comparative Examples are as described below.
(A) Epoxy Resin
  jER828EL (manufactured by Mitsubishi Chemical Corporation): liquid bisphenol A type epoxy resin, epoxy equivalents (185 g/eq), transmittance (91.8%)
  jER1001B80 (manufactured by Mitsubishi Chemical Corporation): solid bisphenol A type epoxy resin, epoxy equivalents (475 g/eq), transmittance (91.6%)
(B) Calcined Hydrotalcite
  KW2200 (manufactured by Kyowa Chemical Industry Co., Ltd.): average particle size (0.4 μm), BET specific surface area (146 m$^2$/g)
(C) Talc
  FG-15 (manufactured by Nippon Talc Co., Ltd.): talc, average particle size (1.4 μm)
(D) Silica
  MEK-EC-2130Y (manufactured by NISSAN CHEMICAL INDUSTRIES, LTD.): organic solvent dispersed colloidal silica (silica particle size: 10-15 nm, solid content 30 mass %, MEK solvent)
(E) Phenoxy Resin
  YL7213B35 (manufactured by Mitsubishi Chemical Corporation): transmittance (91.4%), weight average molecular weight (about 38,000)
(F) Surface Treating Agent
  KBM403 (manufactured by Shin-Etsu Chemical Co., Ltd.): silane coupling agent (3-glycidyloxypropyltrimethoxysilane)
(G) Curing Agent (Ion Liquid)
  TBP N-Ac-Gly (synthetic product): tetrabutylphosphonium N-acetylglycinate The ion liquid was synthesized by the following procedure.

To aqueous tetrabutylphosphonium hydroxide (41.4 mass %) solution (manufactured by HOKKO CHEMICAK INDUSTRY CO., LTD.) (20.0 g) was added at 0° C. N-acetylglycine (manufactured by Tokyo Chemical Industry Co., Ltd.) (3.54 g) and the mixture was stirred for 10 min. After depressurizing to 40-50 mmHg by using an evaporator, the mixture was concentrated at 60-80° C. for 2 hr, and at 90° C. for 5 hr. The concentrate was dissolved again in ethyl acetate (manufactured by Junsei Chemical Co., Ltd.) (14.2 ml) at room temperature and, after depressurizing to 40-50 mmHg by using an evaporator, the mixture was concentrated at 70-90° C. for 3 hr. Tetrabutylphosphonium N-acetylglycinate (11.7 g) (purity: 96.9%) was obtained as an oily compound.
[NMR Spectrum]
$^1$HNMR (CDCl$_3$) d: 0.89-0.99 (m, 12H), 1.42-1.55 (m, 16H), 1.92 (s, 3H), 2.24-2.35 (m, 8H), 3.66 (d, J=3.8 Hz, 2H), 6.70 (br s, 1H)
(H) Curing Accelerator
  U-3512T (manufactured by San-Apro Ltd.): aromatic dimethylurea Experimental Example 1: Examples 1-5, Comparative Examples 1-3

A varnish of a resin composition having a mixing ratio shown in the upper panel of the following Table 1 was prepared by the following procedure. A mixture of a silane coupling agent ("KBM-403" manufactured by Shin-Etsu Chemical Co., Ltd.), a talc powder ("FG15" manufactured by Nippon Talc Co., Ltd.), and calcined hydrotalcite ("KW2200" manufactured by Kyowa Chemical Industry Co., Ltd.) dispersed in a liquid bisphenol A type epoxy resin ("jER828EL" manufactured by Mitsubishi Chemical Corporation) by a three-roll mill (mixture A), a mixture of a curing accelerator ("U-3512T" manufactured by San-Apro Ltd.) dissolved in a phenoxy resin ("YL7213" manufactured by Mitsubishi Chemical Corporation, 35 mass % MEK solution) (mixture B), a 80 mass % MEK solution of a solid bisphenol A type epoxy resin ("jER1001" manufactured by Mitsubishi Chemical Corporation), an organic solvent dispersed colloidal silica (amorphous silica particle size 10-15 nm (BET specific surface area 272-181 m$^2$/g), solid content 30 mass %, MEK solvent, "MEK-EC-2130Y" manufactured by NISSAN CHEMICAL INDUSTRIES, LTD.), and an ion liquid curing agent (tetrabutylphosphonium N-acetylglycinate) were mixed, and uniformly dispersed by a high-speed rotary mixer to give a varnish-like resin composition.

Then, a varnish of the resin composition was uniformly applied by a die coater to a mold release-treated surface of a PET film (thickness 38 μm) treated with an alkyd mold release agent such that the thickness of the resin composition layer after drying was 30 μm, and dried at 60-80° C. for 6 min to give a sealing sheet. Then, the obtained sealing sheet was subjected to the following evaluation test.

In Table 1, the numerical value of each column in the upper panel is the amount of each material to be used (parts by mass), and the numerical value in the parentheses is a solid content (parts by mass).

1. Transmittance (Evaluation of Transparency)

A sealing sheet comprising a PET film as a support (PET film thickness 38 μm, resin composition layer thickness 20 μm) was cut into length 50 mm, width 20 mm and laminated on a glass plate (microslide glass of length 76 mm, width 26 mm, thickness 1.2 mm, Matsunami Glass Ind., Ltd., white slide glass S1112 ground edges No. 2). Then, the PET film was detached, and the same glass plate as that mentioned above was further laminated on the exposed sealing sheet. The obtained laminate was heat hardened on the hot plate at 110° C. for 30 min (insulating layer thickness 20 μm), and the light transmittance spectrum of the sample was measured using a fiber type spectrophotometer (MCPD-7700, type 311C, manufactured by OTSUKA ELECTRONICS Co., LTD, external light source unit: halogen lamp MC-2564 (24 V, 150 W spec) mounting a 8° floodlighting φ60 mm integrating sphere (type name SRS-99-010, reflectivity 99%). The light transmittance was the total light transmittance containing a reflection component and a diffusion component in the parallel line transmittance wherein the distance between the integrating sphere and the sample was 0 mm. Reference was air, and the value at 450 nm was taken as the transmittance.

2. Peel Strength (Evaluation of Adhesive Strength)

A sealing sheet comprising a PET film as a support was cut into length 50 mm, width 20 mm and laminated on an aluminum foil (length 100 mm, width 25 mm (thickness 50 μm, manufactured by TOYO TOKAI ALUMINUM HANBAI K.K.)). Thereafter, the PET film was detached, and a glass plate (length 76 mm, width 26 mm, thickness 1.2 mm, microslide glass) was further laminated on the exposed sealing sheet. The obtained laminate was hardened by heating at 110° C. for 30 min on a hot plate, and the adhesive strength when detached in 90 degree direction relative to the length direction of the aluminum foil was measured (tension rate 50 mm/min). The measurement was made with the sample number (n)=2, and the average value was adopted.

3. Evaluation of Resistance to Moisture Permeability

A laminate for peel strength evaluation which was produced in the same manner as above was maintained under the conditions of 121° C., 100% RH for 24 hr, and a flooded area from the end surface of the sealing sheet was compared by a microscope and taken as an index of the resistance to moisture permeability.

flooded area of 0-0.5 mm from the sheet end surface is good (◯), flooded area exceeding 0.5 mm and not more than 1.0 mm, or having small water foams with diameter of less than 0.5 mm is acceptable (Δ), flooding degree exceeding 1.0 mm, or having large water foams with diameter of not less than 0.5 mm is bad (x).

Figure 2:
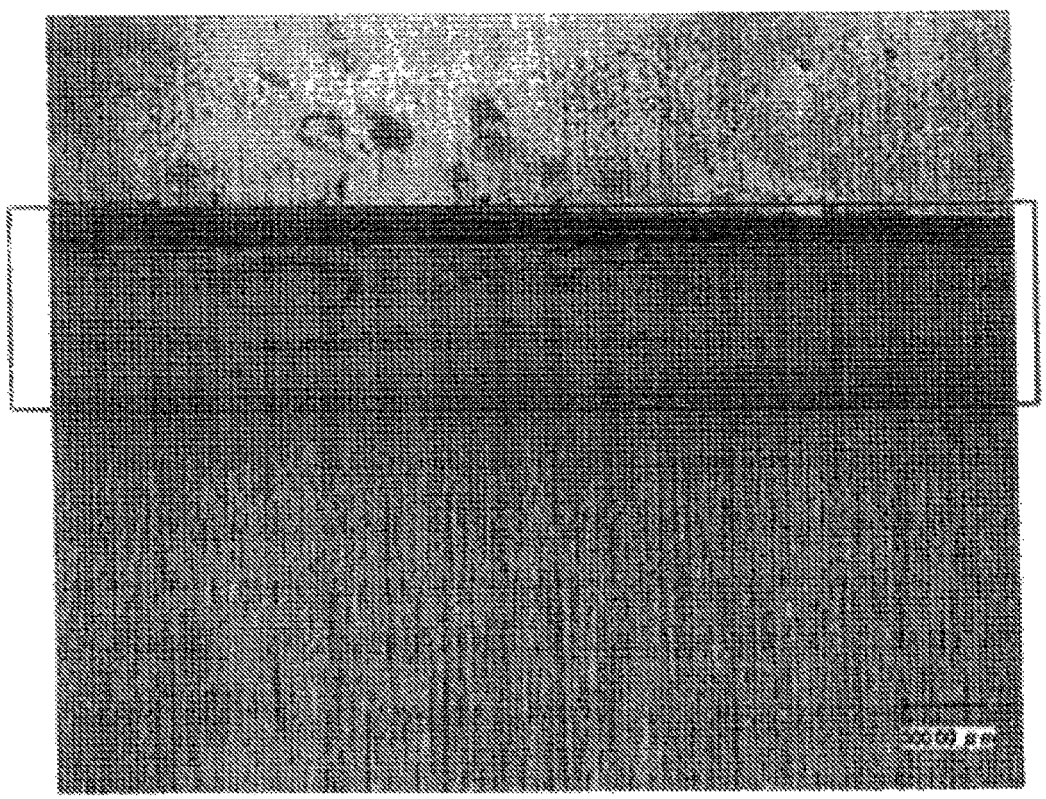
FIG. 2 is a representative photograph of a flooded area evaluated to have acceptable resistance to moisture permeability in a moisture resistance permeability test. In the Figure, the enclosing line is applied to specify the flooded area.
Figure 3:
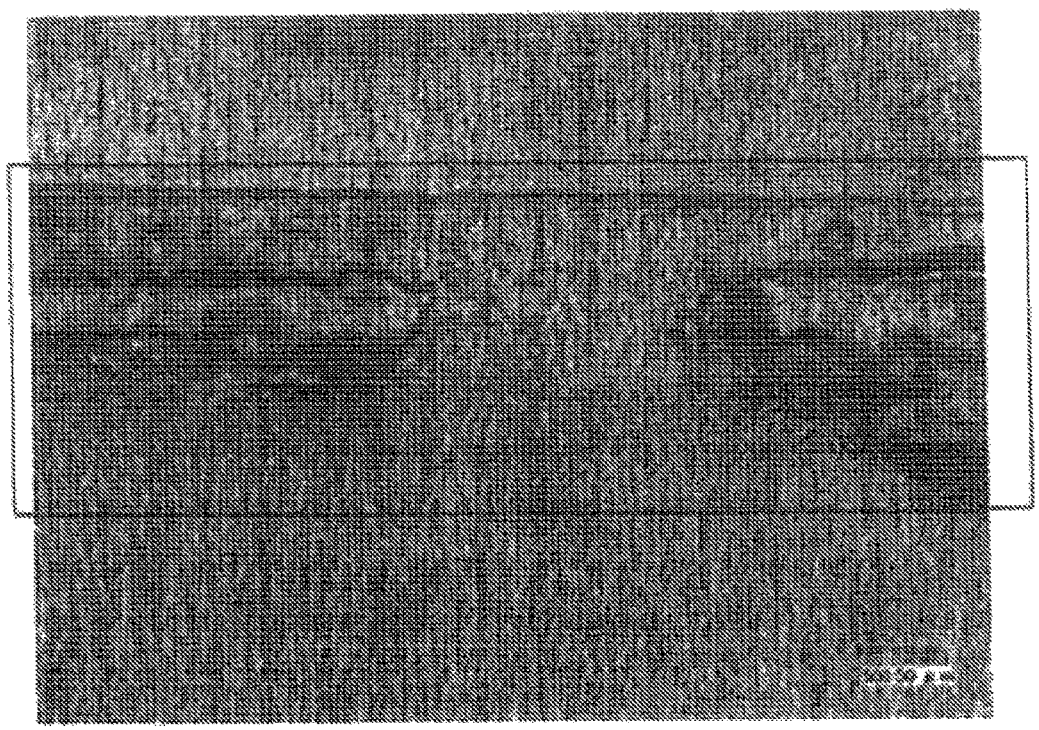
FIG. 3 is a representative photograph of a flooded area evaluated to have bad resistance to moisture permeability in a moisture resistance permeability test. In the Figure, the enclosing line is applied to specify the flooded area.

FIG. 1 is a representative photograph of a flooded area evaluated to have good (◯) resistance to moisture permeability, FIG. 2 is a representative photograph of a flooded area evaluated to have acceptable (Δ) resistance to moisture permeability, and FIG. 3 is a representative photograph of a flooded area evaluated to have bad (x) resistance to moisture permeability.

4. Handling Property

In a liquid bisphenol A type epoxy resin ("jER828EL" manufactured by Mitsubishi Chemical Corporation) were dispersed a silane coupling agent ("KBM-403" manufactured by Shin-Etsu Chemical Co., Ltd.), a talc powder ("FG-15" manufactured by Nippon Talc Co., Ltd.), and calcined hydrotalcite ("KW2200" manufactured by Kyowa Chemical Industry Co., Ltd.) in a three-roll mill to prepare a mixture (mixture A), and a mixture that is had too high viscosity and could not permit appropriate dispersion in a three-roll mill was evaluated as inappropriate (x).

In Comparative Example 1, talc and calcined hydrotalcite were not used, and in Comparative Example 2, calcined hydrotalcite was not used.

TABLE 1

|   |   |   | Ex. 1 | Ex. 2 | Ex. 3 | Ex. 4 | Ex. 5 | Comp. Ex. 1 | Comp. Ex. 2 | Comp. Ex. 3 |
|---|---|---|---|---|---|---|---|---|---|---|
| (A) | bisphenol A type epoxy resin | 828EL |   |   |   |   | 56 |   |   |   |
| (A) | bisphenol A type epoxy resin | 1001B80 |   |   |   |   | 30 (24) |   |   |   |
| (B) | calcined hydrotalcite | KW2200 | 5 | 10 | 21 | 30 | 35 | 0 |   | 40 |
| (C) | talc | FG-15 |   |   |   | 2 |   | 0 | 2 |   |
| (D) | silica | EC2130Y (NV.30) |   |   |   |   | 20 (6) |   |   |   |
| (E) | phenoxy resin | YL7213B35 |   |   |   |   | 81 (28.4) |   |   |   |
| (F) | silane coupling agent | KBM403 |   |   |   |   | 1.2 |   |   |   |
| (G) | ion liquid | TBP Gly |   |   |   |   | 3 |   |   |   |
| (H) | curing accelerator | U-3512T |   |   |   |   | 1.5 |   |   |   |
|   | property evaluation |   |   |   |   |   |   |   |   |   |
|   | transmittance (%@450 nm) |   | 88.2 | 89.3 | 90.1 | 89.4 | 89.5 | 85.1 | 84 | 80.1 |
|   | peel strength (g/10 mm) |   | 476 | 460 | 567 | 656 | 522 | 425 | 499 | 108 |
|   | resistance to moisture permeability |   | Δ | ◯ | ◯ | ◯ | ◯ | X | X | ◯ |
|   | handling property |   | ◯ | ◯ | ◯ | ◯ | ◯ | ◯ | ◯ | X |

Experimental Example 2: Examples 6-8, Comparative Example 4

A varnish of the resin composition having the mixing ratio in the upper panel of the following Table 2 was prepared by a procedure similar to that in the aforementioned Experimental Example 1, and a sealing sheet was produced from the obtained varnish of the resin composition by a procedure similar to that in the aforementioned Experimental Example 1. Then, the obtained sealing sheet was subjected to the aforementioned evaluation test.

In Table 2, the numerical value of each column in the upper panel is the amount of each material to be used (parts by mass), and the numerical value in the parentheses is a solid content (parts by mass).

TABLE 2

|     |     |     | Ex. 6 | Ex. 7 | Ex. 8 | Comp. Ex. 4 |
| --- | --- | --- | --- | --- | --- | --- |
| (A) | bisphenol A type epoxy resin | 828EL | | | 56 | |
| (A) | bisphenol A type epoxy resin | 1001B80 | | | 30 (24) | |
| (B) | calcined hydrotalcite | KW2200 | | | 21 | |
| (C) | talc | FG-15 | 2 | 8 | 16 | 20 |
| (D) | silica | EC2130Y (NV.30) | | | 20 (6) | |
| (E) | phenoxy resin | YL7213B35 | | | 81 (28.4) | |
| (F) | silane coupling agent | KBM403 | | | 1.2 | |
| (G) | ion liquid | TBP Gly | | | 3 | |
| (H) | curing accelerator | U-3512T | | | 1.5 | |
| property evaluation | | | | | | |
| transmittance (%@450 nm) | | | 90.1 | 88.1 | 85 | 83.6 |
| peel strength (g/10 mm) | | | 567 | 595 | 559 | 377 |
| resistance to moisture permeability | | | ○ | ○ | ○ | ○ |

Experimental Example 3: Examples 9-11, Comparative Examples 5-7

A varnish of the resin composition having the mixing ratio in the upper panel of the following Table 3 was prepared by a procedure similar to that in the aforementioned Experimental Example 1, and a sealing sheet was produced from the obtained varnish of the resin composition by a procedure similar to that in the aforementioned Experimental Example 1. Then, the obtained sealing sheet was subjected to the aforementioned evaluation test.

In Table 3, the numerical value of each column in the upper panel is the amount of each material to be used (parts by mass), and the numerical value in the parentheses is a solid content (parts by mass).

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A sealing resin composition, comprising:
    (A) at least one epoxy resin;
    (B) calcined hydrotalcite;
    (C) talc; and
    (D) silica,
    wherein, based on 80 parts by mass of (A) said at least one epoxy resin:
    (B) said calcined hydrotalcite is present in an amount of 5 to 38 parts by mass;
    (C) said talc is present in an amount of 2 to 16 parts by mass; and
    (D) said silica is present in an amount of 6 to 16 parts by mass,
    which affords a cured product of thickness of 20 μm having a transmittance of not less than 84% at 450 nm when the resin composition is heat hardened at 110° C. for 30 min.

2. The resin composition according to claim 1, wherein (A) said epoxy resin has a transmittance of not less than 90%.

3. The resin composition according to claim 2, further comprising:
    (E) at least one thermoplastic resin in an amount of 1 to 40 parts by mass, based on 80 parts by mass of (A) said at least one epoxy resin.

4. The resin composition according to claim 3, wherein (E) said at least one thermoplastic resin is a phenoxy resin.

TABLE 3

|     |     |     | Ex. 9 | Ex. 10 | Ex. 11 | Comp. Ex. 5 | Comp. Ex. 6 | Comp. Ex. 7 |
| --- | --- | --- | --- | --- | --- | --- | --- | --- |
| (A) | bisphenol A type epoxy resin | 828EL | | | | 56 | | |
| (A) | bisphenol A type epoxy resin | 1001B80 | | | | 30 (24) | | |
| (B) | calcined hydrotalcite | KW2200 | | | | 21 | | |
| (C) | talc | FG-15 | | | | 2 | | |
| (D) | silica | EC2130Y (NV.30) | 20 (6) | 40 (12) | 47 (14) | 60 (18) | 0 | 90 (27) |
| (E) | phenoxy resin | YL7213B35 | | | | 81 (28.4) | | |
| (F) | silane coupling agent | KBM403 | | | | 1.2 | | |
| (G) | ion liquid | TBP Gly | | | | 3 | | |
| (H) | curing accelerator | U-3512T | | | | 1.5 | | |
| property •evaluation | | | | | | | | |
| transmittance (%@450 nm) | | | 90.1 | 88.6 | 86.9 | 86.1 | 85.7 | 75.8 |
| peel strength (g/10 mm) | | | 567 | 235 | 52 | 34 | 531 | 33 |
| resistance to moisture permeability | | | ○ | ○ | Δ | X | X | X |

5. The resin composition according to claim 4, wherein (E) said at least one thermoplastic resin has a transmittance of not less than 90%.

6. The resin composition according to claim 3, wherein (E) said at least one thermoplastic resin has a transmittance of not less than 90%.

7. The resin composition according to claim 1, further comprising:
(E) at least one thermoplastic resin in an amount of 1 to 40 parts by mass, based on 80 parts by mass of (A) said at least one epoxy resin.

8. The resin composition according to claim 7, wherein (E) said at least one thermoplastic resin is a phenoxy resin.

9. The resin composition according to claim 8, wherein (E) said at least one thermoplastic resin has a transmittance of not less than 90%.

10. The resin composition according to claim 7, wherein (E) said at least one thermoplastic resin has a transmittance of not less than 90%.

11. The resin composition according to claim 1, further comprising:
(F) at least one surface treating agent in an amount of 0.1 to 3 parts by mass, based on 80 parts by mass of (A) said at least one epoxy resin.

12. The resin composition according to claim 11, wherein (F) said at least one surface treating agent is a silane coupling agent.

13. The resin composition according to claim 1, which affords a cured product having a transmittance of not less than 84%.

14. The resin composition according to claim 1, further comprising:
(G) at least one curing agent in an amount of 0.1 to 3 parts by mass, based on 80 parts by mass of (A) said at least one epoxy resin.

15. The resin composition according to claim 14, wherein (G) said at least one curing agent is an ion liquid.

16. A sealing sheet, comprising a support and a layer of a resin composition according to claim 1 formed on said support.

17. The sealing sheet according to claim 16, wherein the flooded area from the end surface of the sealing sheet is 0 to 0.5 mm from the sheet end surface.

18. The resin composition according to claim 1, wherein the average particle size of said talc is 0.5 to 2 µm.

19. The resin composition according to claim 1, wherein the BET specific surface area of said silica is 2720 to 27 $m^2/g$.

20. The resin composition according to claim 1, wherein the BET specific surface area of said calcined hydrotalcite is 5 to 200 $m^2/g$.

21. The resin composition according to claim 1, wherein the average particle size of said talc is 0.5 to 2 µm, the BET specific surface area of said silica is 2720 to 27 $m^2/g$, and the BET specific surface area of said calcined hydrotalcite is 5 to 200 $m^2/g$, and which affords a cured product of thickness of 20 µm having a transmittance of not less than 84% when the resin composition is heat hardened at 110° C. for 30 min.

22. The resin composition according to claim 1, wherein at least 10 mass % of the whole epoxy resin is liquid at room temperature (25° C.).

* * * * *